(12) United States Patent
Pfeiffer et al.

(10) Patent No.: US 7,540,978 B2
(45) Date of Patent: Jun. 2, 2009

(54) USE OF AN ORGANIC MATRIX MATERIAL FOR PRODUCING AN ORGANIC SEMICONDUCTOR MATERIAL, ORGANIC SEMICONDUCTOR MATERIAL AND ELECTRONIC COMPONENT

(75) Inventors: Martin Pfeiffer, Dresden (DE); Jan Blochwitz-Nimoth, Dresden (DE); Andrea Lux, Dresden (DE); Josef Salbeck, Kassel (DE)

(73) Assignee: Novaled AG, Dresden (DE)

(*) Notice: Subject to any disclaimer, the term of this patent is extended or adjusted under 35 U.S.C. 154(b) by 148 days.

(21) Appl. No.: 11/196,491

(22) Filed: Aug. 3, 2005

(65) Prior Publication Data

US 2006/0049397 A1 Mar. 9, 2006

(30) Foreign Application Priority Data

Aug. 5, 2004 (DE) ......................... 10 2004 037 897
Dec. 23, 2004 (EP) ................................ 04030606

(51) Int. Cl.
*H01B 1/00* (2006.01)
*H01L 29/08* (2006.01)
*H01J 1/62* (2006.01)
*H01L 31/00* (2006.01)

(52) U.S. Cl. .................... 252/500; 257/40; 257/103; 313/503; 313/504; 136/263

(58) Field of Classification Search ............. 252/500; 257/40, 103; 313/503, 504; 136/263
See application file for complete search history.

(56) References Cited

U.S. PATENT DOCUMENTS

| | | |
|---|---|---|
| 3,644,770 A | 2/1972 | Bell |
| 3,673,011 A | 6/1972 | Strull |
| 4,066,569 A | 1/1978 | Lim |
| 4,356,429 A | 10/1982 | Tang |
| 4,618,453 A | 10/1986 | Kim |
| 4,769,292 A | 9/1988 | Tang et al. |
| 5,093,698 A | 3/1992 | Egusa |

(Continued)

FOREIGN PATENT DOCUMENTS

AU 2003229476 9/2003

(Continued)

OTHER PUBLICATIONS

Blochwitz, J., et al, "Low Voltage Organic Light Emitting Diodes featuring Doped Phthalocyanine as Hole Transport Material," *Applied Physics Letters*, vol. 73, No. 6, Aug. 10, 1998 pp. 729-731.

(Continued)

*Primary Examiner*—Mark Kopec
*Assistant Examiner*—Jaison P Thomas
(74) *Attorney, Agent, or Firm*—Sutherland, Asbill & Brennan, LLP (57) ABSTRACT

The present invention relates to use of an organic matrix material for producing an organic semiconductor material, characterized in that the organic matrix material is comprised at least partly of a spirobifluorene compound, and the glass transition temperature of the organic matrix material is at least 120° C. and the highest occupied molecular orbital (HOMO) of the matrix material is at a maximum energy level of 5.4 eV; and also to an organic semiconductor material and electronic component.

9 Claims, 2 Drawing Sheets

U.S. PATENT DOCUMENTS

| | | |
|---|---|---|
| 5,110,835 A | 5/1992 | Walter et al. |
| 5,247,226 A | 9/1993 | Sato et al. |
| 5,292,881 A | 3/1994 | Berneth et al. |
| 5,556,524 A | 9/1996 | Albers |
| 5,703,436 A | 12/1997 | Forrest et al. |
| 5,736,881 A | 4/1998 | Ortiz |
| 5,757,026 A | 5/1998 | Forrest et al. |
| 5,811,833 A | 9/1998 | Thompson |
| 5,834,893 A | 11/1998 | Bulovic et al. |
| 5,840,217 A | 11/1998 | Lupo et al. |
| 5,969,474 A | 10/1999 | Aria |
| 6,013,384 A | 1/2000 | Kido et al. |
| 6,046,543 A | 4/2000 | Bulovic |
| 6,111,696 A | 8/2000 | Allen et al. |
| 6,160,828 A | 12/2000 | Kozlov et al. |
| 6,303,238 B1 | 10/2001 | Thompson et al. |
| 6,310,360 B1 | 10/2001 | Forrest et al. |
| 6,350,534 B1 | 2/2002 | Boerner et al. |
| 6,406,804 B1 | 6/2002 | Higashi |
| 6,414,661 B1 | 7/2002 | Shen |
| 6,423,429 B2 | 7/2002 | Kido et al. |
| 6,437,769 B1 | 8/2002 | Kohayashi |
| 6,473,651 B1 | 10/2002 | Kuzma et al. |
| 6,476,550 B1 | 11/2002 | Oda |
| 6,501,230 B1 | 12/2002 | Feldman |
| 6,555,840 B1 | 4/2003 | Hudson et al. |
| 6,566,807 B1 | 5/2003 | Fujita et al. |
| 6,579,422 B1 | 6/2003 | Kasinuma |
| 6,614,161 B1 | 9/2003 | Jacobsen |
| 6,620,528 B1 | 9/2003 | Yamazaki |
| 6,630,684 B2 | 10/2003 | Lee |
| 6,645,645 B1 | 11/2003 | Adachi et al. |
| 6,700,058 B2 * | 3/2004 | Nelles et al. ............. 136/263 |
| 6,720,573 B2 | 4/2004 | Son |
| 6,734,457 B2 | 5/2004 | Yamazaki |
| 6,747,287 B1 * | 6/2004 | Toguchi et al. ............ 257/40 |
| 6,824,890 B2 * | 11/2004 | Bazan et al. ............. 428/690 |
| 6,835,470 B1 | 12/2004 | Magain |
| 6,867,538 B2 | 3/2005 | Adachi |
| 6,878,297 B1 | 4/2005 | Berger |
| 6,897,473 B1 | 5/2005 | Burroughes et al. |
| 6,900,588 B2 | 5/2005 | Adachi et al. |
| 6,908,783 B1 | 6/2005 | Kuehl et al. |
| 6,933,522 B2 | 8/2005 | Lin |
| 6,965,197 B2 | 11/2005 | Tyan |
| 7,001,536 B2 | 2/2006 | Thompson et al. |
| 7,012,363 B2 | 3/2006 | Weaver |
| 7,074,500 B2 | 7/2006 | Pleiffer |
| 7,081,550 B2 * | 7/2006 | Hosokawa et al. ......... 564/308 |
| 7,141,817 B2 | 11/2006 | Nishi |
| 7,161,292 B2 | 1/2007 | Leo |
| 7,256,541 B2 | 8/2007 | Birnstock |
| 7,345,300 B2 | 3/2008 | Qin |
| 2001/0026124 A1 | 10/2001 | Liu et al. |
| 2001/0035713 A1 | 11/2001 | Kimusra |
| 2001/0038102 A1 | 11/2001 | Kawase |
| 2001/0055841 A1 | 12/2001 | Yamazaki et al. |
| 2002/0015807 A1 | 2/2002 | Sugino et al. |
| 2002/0084993 A1 | 7/2002 | Teneya |
| 2002/0098379 A1 | 7/2002 | Arakane |
| 2003/0062636 A1 | 4/2003 | Chen |
| 2003/0064248 A1 * | 4/2003 | Wolk et al. ............... 428/690 |
| 2003/0122813 A1 | 7/2003 | Ishizuki |
| 2003/0127973 A1 | 7/2003 | Weaver et al. |
| 2003/0146443 A1 | 8/2003 | Yamazaki et al. |
| 2003/0146888 A1 | 8/2003 | Yamazaki |
| 2003/0164679 A1 | 9/2003 | Hamano et al. |
| 2003/0184505 A1 | 10/2003 | Inukai |
| 2004/0012980 A1 | 1/2004 | Sigiura et al. |
| 2004/0066824 A1 | 4/2004 | Magno |
| 2004/0070558 A1 | 4/2004 | Cok |
| 2004/0113547 A1 | 6/2004 | Son |
| 2004/0183963 A1 | 9/2004 | Nakamura |
| 2004/0227446 A1 | 11/2004 | Fujimoto et al. |
| 2004/0251816 A1 | 12/2004 | Leo et al. |
| 2005/0040390 A1 | 2/2005 | Pleiffer et al. |
| 2005/0061232 A1 | 3/2005 | Werner et al. |
| 2005/0110009 A1 | 5/2005 | Blochwitz-Nimoth et al. |
| 2005/0142379 A1 | 6/2005 | Juni |
| 2005/0145179 A1 | 7/2005 | Catteneo |
| 2005/0179399 A1 | 8/2005 | Leo |
| 2005/0236973 A1 | 10/2005 | Leo et al. |
| 2005/0280766 A1 | 12/2005 | Johnson et al. |
| 2006/0033115 A1 | 2/2006 | Blochwitz et al. |
| 2006/0044227 A1 | 3/2006 | Hadcock |
| 2006/0050032 A1 | 3/2006 | Gunner et al. |
| 2006/0071206 A1 | 4/2006 | Stossell et al. |
| 2006/0079004 A1 | 4/2006 | Werner |
| 2006/0214888 A1 | 9/2006 | Schneider |
| 2006/0231843 A1 | 10/2006 | Qin et al. |
| 2006/0250076 A1 | 11/2006 | Hofmann |
| 2006/0273310 A1 | 12/2006 | Birnstock |
| 2006/0279227 A1 | 12/2006 | Burqhart |
| 2006/0284170 A1 | 12/2006 | Leo |
| 2007/0035236 A1 | 2/2007 | Murano |
| 2007/0051946 A1 | 3/2007 | Walzer |
| 2007/0116984 A1 * | 5/2007 | Park et al. ............... 428/690 |
| 2007/0145355 A1 | 6/2007 | Werner |
| 2007/0252140 A1 | 11/2007 | Limmert |
| 2007/0278479 A1 | 12/2007 | Werner |
| 2008/0048557 A1 | 2/2008 | Birnstock |
| 2008/0103315 A1 * | 5/2008 | Egawa et al. ............. 548/442 |
| 2008/0122345 A1 * | 5/2008 | Sakata et al. ............. 313/504 |
| 2008/0143250 A1 | 6/2008 | Blochmitz-Nimoth |
| 2008/0164807 A1 | 7/2008 | Hofmann |
| 2008/0203406 A1 | 8/2008 | He |

FOREIGN PATENT DOCUMENTS

| | | |
|---|---|---|
| CA | 2463377 | 8/2003 |
| DE | 19732828 | 2/1999 |
| DE | 19916745 | 10/2000 |
| DE | 10009204 | 8/2001 |
| DE | 10135513 | 2/2003 |
| DE | 10207859 | 9/2003 |
| DE | 10229231 | 1/2004 |
| DE | 10251986 | 5/2004 |
| DE | 10261609 | 8/2004 |
| DE | 10307125 | 8/2004 |
| DE | 103 57 044 A1 | 7/2005 |
| EP | 0625843 | 11/1994 |
| EP | 1000998 | 5/2000 |
| EP | 1018718 | 7/2000 |
| EP | 1227466 | 7/2002 |
| EP | 1282101 | 2/2003 |
| EP | 1318499 | 6/2003 |
| EP | 1365633 | 11/2003 |
| EP | 1548856 | 6/2005 |
| GB | 239203 | 2/1926 |
| GB | 2361356 | 10/2001 |
| GB | 2388236 | 11/2003 |
| GB | 2390215 | 12/2003 |
| JP | 59031865 | 2/1984 |
| JP | 2004119197 | 4/2004 |
| JP | 2004335557 | 11/2004 |
| WO | 9948160 | 9/1999 |
| WO | 0108230 | 2/2001 |
| WO | 0127910 | 4/2001 |
| WO | 0193642 | 12/2001 |
| WO | 0237580 | 5/2002 |
| WO | 0241414 | 5/2002 |
| WO | 02093664 | 11/2002 |
| WO | 03061028 | 7/2003 |
| WO | 03069958 | 8/2003 |

| WO | 03070822 | 8/2003 |
| WO | 03088271 | 10/2003 |
| WO | 03094140 | 11/2003 |
| WO | 2004025615 | 3/2004 |
| WO | 2004059606 | 7/2004 |
| WO | 2005086251 | 9/2005 |

OTHER PUBLICATIONS

Pfeiffer, M., et al., "Controlled Doping of Phthalocyanine Layers by Cosublimation with Acceptor Molecules: A Systematic Seebeck and Conductivity Study," *Applied Physics Letters*, vol. 73, No. 22, Nov. 30, 1998, pp. 3202-3204.

Huang, Jingsong, et al., "Low operating voltage and high-efficiency organic multilayer electroluminescent devices with p-type doped hole injection layer," Jps. J. Appl. Phys., (2001), vol. 40, pp. 6630-6633.

Hung, L. S., et al., "Recent progress of molecular organic electroluminescent materials and devices," Materials Science and Engineering Reports, 39, 2002, pp. 143-222.

Ikai, M. et al., "Highly Efficient Phosphorescence From Organic light-emitting devices with an exciton-block layer," Appl. Phys. Lett. vol. 79, No. 2, Jul. 9, 2001.

Loannidis, A., et al., "Hole and electron transport in chloroaluminum phtalocyanin thin films," The Journal of Physical Chemistry B, 1997, vol. 101, pp. 5100-5107.

Ishii, M. et al., J. Lumin., 1165 (2000).

J.D. Anderson et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.

Jefferson, Alan M. and Suschitzky, H., "New Route to Nucleophillically Substituted o-phenylenediamines," J. C.S. Chem. Comm. pp. 189-190, 1977.

Jingson Huang et al., "Low-voltage organic electroluminescent devices using pin structures," Applied Physics Letters, vol. 80, No. 1, Jan. 7, 2002, pp. 139-141.

Juno Endo et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.

Junji Kido et al., "Bright Organic Electroluminescent Devices Having a Metal-doped Electron-injecting Layer," Applied Physics Letters, vol. 73, No. 20, Nov. 16, 1998, pp. 2866-2868.

Juni Kido, "Recent progress in organic light-emitting devices," Proceedings of the 1st International Display Manufacturing Conference IDMC 2000, Seoul Korea, Sep. 5, 2000, pp. 399-400.

Katsuyuki Naito, et al., "Molecular design, synthesis, and physical properties of nonpolymeric amorphous dyes for electron transport," The Journal of Physical Chemistry A, 1997, vol. 101, pp. 2350-2357.

Kin-Ya Akiba, et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, 1979.

Kwong, Raymond C., et al., "High operational stability of electrophosphorescent devices," Applied Physics Letters, Jul. 1, 2002, vol. 81, No. 1, pp. 162-164.

L. L. Miller et al., "A simple comprehensive correlation of organic oxidation and ionization potentials," J. Org. Chem., 1972, vol. 37, No. 6, pp. 916-918.

Lampert, M.A., Rep. Progr. Phys. 27, 329 (1964).

Lih, J., et al., SID 03 Digest, "A phosphorescent active-matrix OLED display driven by amorphous silicon backplane," pp. 14-17.

Lo, K. M., et al., J. Organometal. Chem. 1992, 430, 149.

Ludvik, J. and Pragst, F. et al., "Electrochemical generation of triplet states," Journal of Electroanalytical Chemistry, No. 180, pp. 141-156, 1984.

Lupton, J. M. et al., "Bragg scattering from periodically microstructured light emitting diodes," Appl. Phys. Lett., vol. 77, pp. 3340-3342, Nov. 2000.

M. Maitrot et al., "Molecular material based junctions: Formation of a Schottky Contact with Metallophthalocyanine Thin Films Doped by the Cosublimation Method," J. Applied Physics, 60(7), Oct. 1, 1986, pp. 2396-2400.

Murano, S., "Organic Component," U.S. Appl. No. 12/158,482.

Macleod, H. A., Thin Film Optical Fibers, 3rd. Ed., IOP Publishing, 2001, pp. 191-192.

Madigan, C.F., "Improvement of Output coupling efficiency of organic light emitting diodes by backside substrate modification," Appl. Phys. Lett., vol. 76, pp. 1650-1652, Mar. 2000.

Massimo Curini Curini, et al., "Ytterbium Triflate Promoted Synthesis of Benzimidazole Derivatives," Synlett, No. 10, pp. 1832-1834, 2004.

Matsumura M., et al., Applied Physics Letters, 2872 (1998).

Mattoussi, Hedi, et al., "Photoluminescence quantum yield of pure and molecularly doped organic solid films," Journal of Applied Physics, (1999), vol. 86:5, p. 2642.

Mori, T., et al., "Electroluminescence of organic light emitting diodes with alternately deposited dye-doped aluminum quinoline and diamine derivative," Journal of Physics D—Applied Physics, (1999), vol. 32:11, pp. 1198-1203.

Ohmori, Yutaka, et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.

Ohmori, Yutaka, et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.

Pacios, R., et al., "Charge separation in polyfluorene composites with internal donor/acceptor heterojunctions," Synthetic Metals, 2002, vol. 127, pp. 261-265.

Parthasarathy, G. et al., "High-efficiency transparent light-emitting devices," Applied Physics Letters, vol. 76, 15, Apr. 10, 2000, pp. 2128-2130.

Pfeiffer M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Pfeiffer, Martin, et al., "Electrophosphorescent p-i-n organic light-emitting devices for very-high-efficiency flat-panel displays," Advanced Materials, (2002), vol. 14:22, Nov. 18, 2002, pp. 1633-1636.

Ping Lu et al., "Synthesis of octasubstituted cyclooctatetrainees and their use as electron transporters in organic light emitting diodes," Journal of the American Chemical Society, 2000, vol. 1222, pp. 7480-7486.

Pope, et al., "Single positive or negative carriers in organic crystals," Electronic Processes in Organic Crystals and Polymers, Oxford Science Publications, Oxford University Press, (1999), pp. 202-207.

Pudzich, R., et al., "Synthesis and characterization of new oxadizoleamine based spiro-linked fluorescence dyes," Synthetic Metals, 2003, vol. 138, pp. 21-31.

Quast, Helmut and Schmitt, Edeltraud: "Note Regarding the Quaternization of Heterocycles," Institute of Organic Chemistry at the University of Wurzburg, 101, pp. 4012-4014, 1968.

R. Schlaf et al., "Homo/Lumo Alignment at PTCDA/ZnPc and PTCDA/CllnPc Heterointerfaces Determined by Combined UPS and XPS Measurements," J. Phys. Chem. B 1999, 103, pp. 2984-2992.

R.C. Haddon et al., "Conducting films of C60 and C70 by alkali-metal doping," Nature, vol. 350, Mar. 28, 1991, pp. 320-322.

Redecker, M., et al., "Electron transport in starburst phenylquinoxalines," Applied Physics Letters, Jul. 5, 1999, vol. 75, No. 1, pp. 109-111.

S. Hamm, "Rectifying organic juntions of molecular assemblies based on perylene ion salts," J. Chem. Phys., vol. 103, No. 24, Dec. 22, 1995, pp. 10689-10695.

Sakamoto, Gosuke, et al., "Significant improvement of device durability in organic light-emitting diodes by doping both hole transport and emitter layers with rubrene molecules," Applied Physics Letters, (1999), vol. 75:6, pp. 766-768.

Sanford, J.L., et al., SID 03 Digest, "TFT amoled pixel circuits and driving methods," pp. 10-13.

Sato, N., et al., J. Chem. Soc. Faraday Trans. 3, 77, 1621 (1981).

Schnitzer, J., "30% External Quantum Efficiency from Surface Textured, Thin-film Light emitting diodes," Applied Phys. Lett., vol. 63, pp. 2174-2176, Oct. 1993.

Stephen F. Nelsen, "Heterocyclic Radical Anions. II. Naphthalic and 1,4,5,8-Naphthalenetetracarboxylic Acid Derivatives," Journal of the American Chemical Society, 89:23, Nov. 8, 1967, pp. 5925-5931.

Takashi Muramatsu, et al., "Preparation and Properties of a novel heterocyclic dispiro compound, 3, 10-diaza-N, N-dimethyldispiro[5.0.5.3]pentadeca-1,4,8,11-tetraene," Chemistry Letters, pp. 151-152, 1996.

Tang, C. W., et al., "Electroluminescence of doped organic thin films," Journal of Applied Physics, (1989), vol. 65:9, pp. 3610-3616.

Tobat, P., I. Saragi et al., "Organic phototransfer based on intramolecular charge transfer in a bifunctional spiro compound," Applied Physics Letters, Mar. 29, 2004, vol. 84, No. 13, pp. 2334-2336.

Tokito, Shuzuo, et al., "Improvement of emission efficiency in polymer light-emitting devices based on phosphorescent polymers," Thin Solid Films, Dec. 15, 2003, vol. 445, No. 2, pp. 353-357.

Tong B. Tang et al., "Ionization thresholds of merocyanine dyes in the solid state," Journal of Applied Physics, vol. 59, (1), Jan. 1986, pp. 5-10.

Tsujimura, T., et al., SID 03 Digest, "A 20-inch OLED display driven by super-amorphous-silicon technology," pp. 6-9.

Tsutsui, Tetsuo, et al., "High quantum efficiency in organic light emitting devices with iridium-complex as a triplet emissive center," Jps. Journal of Applied Physics, part 2 letters, (1999), vol. 38:12B, pp. L1502-L1504.

Von Jurgen Kauphold, Ber. Bunsen. Phys. Chem. 69, pp. 168-179.

W. B. Jensen, The Generalized Lewis Acid Based Concepts, John Wiley & Sons, New York, 1980, pp. 113-195.

Horst, "Use of metal complexes as emitter in an organic light-emitting component and such a componet," U.S. Appl. No. 12/159,520.

Zhou, X., et al. "High-efficiency electrophosphorescent organic light-emitting diodes with double light-emitting layers," Applied Physics Letters, Nov. 18, 2002, vol. 81, No. 21, pp. 4070-4072.

Weiying Gao et al., "Effect of electrical doping on molecular level alignment at organic-organic heterojunctions," Applied Physics Letters, vol. 82, No. 26, Jun. 30, 2003, pp. 4815-4817.

Wenping Hu et al., "Efficient red electroluminescence from devices having multilayers of a europium complex," Appl. Phys. Lett. vol. 77, No. 26, Dec. 25, 2000.

X. Zhou et al., "Low-voltage inverted transparent vacuum deposited organic light-emitting diodes using electrical doping," Applied Physics Letters, vol. 81, No. 2, Jul. 29, 2002, pp. 922-924.

X. Zhou et al., "Very low operating voltage organic light-emitting diodes using a p-doped amorphous hole injection layer," Applied Physics Letters, vol. 78, No. 4, Jan. 22, 2001, pp. 410-412.

Yamasaki, T et al., "Organic Light emitting device with an ordered monolayer of silica microspheres as a scattering medium," Appl. Phys. Lett., vol. 76, pp. 1243-1245, Mar. 2000.

Yao Fu et al., "Quantum-chemical predictions of Absolute standard redox potentials of diverse organic molecules and free radicals in acetonitrile," J. Am. Chem. Soc. 2005, 127, pp. 7227-7234.

Yasuhiko Shirota, "Organic materials for electronic and optoelectronic devices," Journal of Materials Chemistry, 2000, vol. 10, pp. 1-25.

Yersin, H. and Douges, D., Topics in Curr. Chem. 2001, 214, 81.

Zhi-Ming Zhang, "Organic light emitting diodes based on new oxadiazole and pyrazoline derivatives," China Physics Letters, 2000, vol. 17, No. 6, pp. 454-456.

Zhou C. et al., "Modulated chemical doping of individual carbon nanotubes," Science, American Association for the Advancement of Science, vol. 290, No. 5496, pp. 1552-1555.

A. G. Werner, et al., "Pyronin B as a donor for n-type doping of organic thin films," Applied Physics Letters, vol. 82, No. 25, Jun. 23, 2003, pp. 4495-4497.

A. J. Bard, L. R. Faulkner, "Electrochemical Methods: Fundamentals and Applications," Wiley, 2nd Ed., 2000, pp. 52-55, Appendix C pp. 808-813.

A. Nollau et al., "Controlled n-type doping of a molecular organic semiconductor: naphthalenetetracarboxylic dianhydride (NTCDA) doped with bis(ethylenedithio)-tetrathiafulvalene (BEDT-TTF)," J. Appl. Phys., vol. 87, No. 9, May 1, 2006, pp. 4340-4343.

A. P. Kulkarni et al., "Electron transport materials for organic light-emitting diodes," Chem. Mater. 2004, 16, pp. 4556-4573.

Adachi C. et al., "High-efficiency organic electrophorescent devices with tris (2-phenylpyridine) iridium doped into electron-transporting materials," App. Phys. Lett. vol. 77, No. 6, Aug. 7, 2000.

Adachi, Chihaya, et al., "Efficient electrophosphorescence using a doped ambipolar conductive molecular organic thin film," Organic Electronics 2, (2001), pp. 37-43.

Adachi, Chihaya, et al., "Nearly 100% internal phosphorescence efficiency in an organic light emitting device," Journal of Applied Physics (2001), vol. 90:10, pp. 5048-5051.

Ammermann, Dirk, Dirk et al., "Photonic devices based on crystalline organic semiconductors for optoelectronic integrated circuits," Jps. J. Appl. Phys. Pt. 1 (1995) vol. 34, pp. 1293-1297.

B. A. Gregg et al., "On the superlinear increase in conductivity with dopant concentration in excitonic semiconductors," Applied Physics Letters, vol. 84, No. 10, Mar. 8, 2004, pp. 1707-1709.

B. Maennig et al., "Organic p-i-n solar cells, App. Phys. 2004, A 79, pp. 1-14."

B.W. D'Andrade et al., "Relationship between the ionization and oxidation potentials of molecular organic semiconductors," Organic Electronics 6, 2005, pp. 11-20.

Baldo, M. A. et al., "High efficiency fluorescent organic light-emitting devices using a phosphorescent sensitizer," Nature, (2000), vol. 403, pp. 750-753.

Baldo, M. A. et al., "Transient analysis of organic electrophosphorescence: I. Transient analysis of triplet energy transfer," Physical Review B, (2000), vol. 62:16, pp. 10958-10966.

Baldo, M. A. et al., "Very high-efficiency green organic light-emitting devices based on electrophosphorescence," Applied Physics Letters, (1999), vol. 75:1, pp. 4-6.

Baldo, M. A., et al., "Transient analysis of organic electrophosphorescence II. Transient analysis of triplet-triplet annihilation," Physical Review B, (2000), vol. 62:16, pp. 10967-10977.

Baldo, Marc, et al., "Organic vapor phase deposition," Advanced Materials, 1998, 10, No. 18, pp. 1505-1514.

Bastard, G., "Wave mechanics applied to semiconductor heterostructures," The Editions of Physique, (1988) pp. 64-67.

Blochwitz, J. et al., Org. Electronics 2, 97 (2001).

Birnstock, J., et al., "Method for depositing a vapour deposition material," U.S. Appl. No. 12/134,469.

Blochwitz, J., et al., "Non-polymeric OLEDs with a doped amorphous hole transport layer and operating voltages down to 3.2 V to achieve 100 cd/m2," Synthetic Metals, (2002), vol. 127, pp. 169-173.

Bloom, C. J. et al., "Low work function reduced metal complexes as cathodes in organic electroluminescent devices," J. of Phyiscal Chemistry B, vol. 107, No. 13, pp. 2933-2938.

Burroughes, J. H., et al., "Light-emitting diodes based on conjugated polymers," Nature, vol. 347, Oct. 11, 1990, pp. 539-541.

C.W. Tang et al., "Organic electroluminescent diodes," Applied Physics Letters, vol. 51, No. 12, Sep. 21, 1987, pp. 913-915.

Campbell, Alasdair, J. et al., "Dispersive electron transport in an electroluminescent polyfluorene copolymer measured by the current integration time of flight method," Applied Physics Letters, Oct. 1, 2001, vol. 79, No. 14 pp. 2133-2135.

Carter, S. A. et al., "Enhanced luminance in polymer composite light emitting devices," Appl. Phys. Lett., vol. 71, pp. 1145-1147, Sep. 1997.

Chassot L. and Von Zelewsky A., Inorg. Chem., 26, 281 (1987).

Chimed Ganzorg et al., "p-Typed Semiconducts of Aromatic Diamines Doped with SbCl5," Chemistry Letters 2000, pp. 1032-1033.

Chung-Chih Wu et al., "Efficient organic blue-light-emitting devices with double confinement on terfluorenes with ambipolar carrier transport properties," Advanced Materials, Jan. 5, 2004, vol. 16, No. 1, pp. 61-65.

Connelly, N. G. et al., Chem. Rev., 96, 877 (1996).

D. Oeter et al., "Doping and Stability of Ultrapure alpha-oligothiophene Thin Films," Synthetic Metals, 61, 1993, pp. 147-150.

D'Andrade, Brian W., "Operational stability of electrophosphorescent devices containing p and n doped transport layers," Applied Physics Letters, vol. 83, No. 19, Nov. 10, 2003, pp. 3858-3860.

D'Andrade, Brian W, et al., "Efficient organic electrophosphorescent white-light emitting device with a triple doped emissive layer," Advanced Materials, No. 7, 16, Apr. 5, 2004. pp. 624-628.

D'Andrade, Brian W., et al., "High-efficiency yellow double-doped organic light-emitting devices based on phosphorsensitized fluorescence," Appl. Phys. Lett., (2001), vol. 79:7, pp. 1045-1047.

Deluca, Mark et al., "The p-toluenesulfonic acid promoted synthesis of 2-substituted benzoxazoles and benzimidazoles from diacylated precursors," Tetrahedron, vol. 53, No. 2, pp. 457-464, 1997.

Du-Zen Peng et al., "P-134: Novel Pixel Compensation Circuit for AMOLED Display," 2005 SID International Symposium, SID 05 Digest, San Jose, CA May 24, 2005, pp. 814-817.

Elwell, D., "Electrocrystallization of semiconducting materials from molten salt and orgnaic solutions," Journal of Crystal Growth, vol. 52, 1981, pp. 741-752.

Fenghong Li et al., "Leuco Crystal Violet as a dopant for n-doping of organic thin films of fullerene C60," J. Phys. Chem. B 2004, 108, pp. 17076-17088.

G. D. Sharma et al.,"Influence of Iodine on the Electrical and Photoelectrical Properties of Zinc Phthalocyanine Think Film Devices," Materials Science and Engineering, B41, 1996, pp. 222-227.

G. Klopman, "Chemical Reactivity and the Concept of Charge-and Frontier-controlled reactions," Journal of the American Chemical Society., vol. 90, No. 2, Jan. 17, 1968, pp. 223-234.

G. Parthasarthy, et al., "Lithium doping of semiconducting organic charge transport materials," J. Appl. Phys., vol. 89, No. 9, May 1, 2001, pp. 4986-4992.

Gao Y. et al., "Cs doping and energy level shift in CuPC", Chemical Physics Letters. North-Holland, Amsterdam, NL, vol. 380, Oct. 21, 2003, p. 451-455.

Grimmett M. Ross, "Imidazole and benzimidazole synthesis," Tables of Contents, pp. 1-10, Academic Press, Harcourt Brace & Company, Publishers, London, San Diego, NY, Boston et al., 1997.

Gu, G., et al., "Transparent organic light emitting devices," Applied Physics Letters, (1996), vol. 68:19, pp. 2606-2608.

Gufeng He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Hararada Kentaro et al., "Realization of organic pn-homojunction using a novel n-type doping technique," Proceedings of SPIE—The international Society for Optical Engineering; Organic Optoelectronics and Photonics 2004, vol. 5464, Sep. 2004, pp. 1-9.

Heinze, Jurgen et al., "Polarographic studies of the conformation of 1,2,3,4,5-pentaarylimidazolium cations," The Institute for Physical Chemistry at the University of Freiburg, pp. 1-22, 1972.

Hideyuki Murata, et al., "Efficient organic light-emitting diodes with undoped active layers based on silole derivatives," Applied Physics Letters, Jan. 14, 2002, vol. 80, No. 2, pp. 189-191.

Hino Yuichi, et al., "Efficient low molecule phosphorescent organic light emitting diodes fabricated by wet-processing," Organic Electronics, Aug. 8, 2004, vol. 5, pp. 265-270.

Huang, Jingsong, et al., "Influence of the thickness and doping of the emission layer on the performance of organic light-emitting diodes with PiN structures," Journal of Applied Physics, (2003), vol. 93:2, pp. 838-844.

Bach, U. et al. "Solid-state dye-sensitized mesoporous TiO2 solar cells high photon-to-electron conversion efficiencies," Nature, vol. 395, Oct. 8, 1998, pp. 583-585.

Zhou, X. et al. "Enhances hole injection into amorphous hole-transport layers of organic light-emitting diodes using controlled p-type doping," Adv. Funct. Mater., 2001, 11, No. 4, pp. 310-314.

* cited by examiner

USE OF AN ORGANIC MATRIX MATERIAL FOR PRODUCING AN ORGANIC SEMICONDUCTOR MATERIAL, ORGANIC SEMICONDUCTOR MATERIAL AND ELECTRONIC COMPONENT

TECHNICAL FIELD

The present invention relates to the use of an organic matrix material for producing an organic semiconductor material, and also to an organic semiconductor material comprising an organic matrix material and an organic dopant, and also to an electronic component.

BACKGROUND OF THE INVENTION

It is known that doping can alter organic semiconductors with regard to their electrical properties, in particular their electrical conductivity, as is also the case for inorganic semiconductors such as silicon semiconductors.

In this case, generation of charge carriers in a matrix material increases the initially quite low conductivity and, depending on the type of the dopant used, achieves a change in the Fermi level of the semiconductor. Doping leads to an increase in the conductivity of the charge transport layer, which reduces resistance losses, and leads to an improved transition of the charge carriers between contacts and organic layer.

For the doping of such organic semiconductors, strong electron acceptors such as tetracyanoquinonedimethane (TCNQ) or 2,3,5,6-tetrafluorotetracyano-1,4-benzoquinonedimethane (F4-TCNQ) have become known; see M. Pfeiffer, A. Beyer, T. Fritz, K. Leo, Appl. Phys. Lett., 73 (22), 3202-3204 (1998) and J. Blochwitz, M. Pfeiffer, T. Fritz, K. Leo, Appl. Phys. Lett., 73 (6), 729-732 (1998). As a result of electron transfer processes in electron donor-like base materials (hole transport materials), these generate what are known as holes, the number and mobility of which more or less significantly alter the conductivity of the matrix material.

Known matrix materials are, for example, starburst compounds such as 4,4',4"-tris(diphenylamino)triphenylamine (TDATA), 4,4',4"-tris(3-methylphenylphenylamino)-triphenylamine (m-MTDATA) and N,N,N',N'-tetrakis(4-methoxyphenyl)benzidine (MeO-TPD).

The chemical structure of the abovementioned known matrix materials is shown below:

Starburst = m-MTDATA
4,4',4"-tris(3-methylphenylamino)-triphenylamine

Starburst = TDATA
4,4',4"-tris(N,N-diphenylamino)-triphenylamine

TDATA

MeO-TPD

However, these compounds are thermally unstable, i.e. they have a low glass transition temperature and tend to crystallization at low temperatures, which leads ultimately to unstable electronic components.

The glass transition temperature is regarded as being the temperature at which motion of the molecules in the event of rapid cooling of the material from the melt is no longer possible for kinetic reasons, and thermodynamic parameters such as the heat capacity or the coefficient of expansion suddenly change from typical liquid values to typical solid values. The thermal stability of the matrix material is of significance especially for morphological reasons when organic semiconductor materials are used with such matrix materials, in order to prevent the formation of roughness at elevated operating temperatures in the customary layer structure of such semiconductor materials. Furthermore, the thermal stability is of significance, in order to restrict the diffusion of the dopant within the matrix material.

The prior art also discloses thermally stable matrix materials such as 2,2',7,7'-tetrakis(N,N-diphenylamino)-9,9'-spirobifluorene (spiro-TAD) which, however, owing to the position of the energy level of their highest occupied molecular orbitals (HOMOs), cannot be doped.

(Spiro-TAD)

(II; Spiro-TM-TAD)

SUMMARY OF THE INVENTION

It is an object of the invention to provide for use of an organic matrix material for producing an organic semiconductor material, the matrix material being thermally stable and dopable, in order to provide hole transport layers having high hole conductivity for use in organic semiconductor components. Furthermore, it should be possible to apply the organic matrix materials by vapour deposition in order to provide layers having a correspondingly high hole conductivity by coevaporation under reduced pressure with a strong organic electron acceptor.

This object is achieved by the organic matrix material being comprised at least partly of a spirobifluorene compound of the formula (I)

(I; R-Spiro-TAD)

where R is at least one substituent on a phenyl radical, but not all of R are simultaneously hydrogens,
and/or of the formula (II)

where R is a substituent apart from hydrogen and R' is a substituent, the glass transition temperature of the organic matrix material being at least 120° C. and the highest occupied molecular orbital (HOMO) of the matrix material lying at a maximum energy level of 5.4 eV. In formula (I), a phenyl radical may thus be provided with one or more substituents.

It is preferred that each R and/or R' in formula (I) and (II) is independently selected from the group consisting of hydrogen, methyl, ethyl, n-propyl, isopropyl, n-butyl, isobutyl, tert-butyl, $NH_2$, $N(CH_4)_2$ and $NPh_2$, where not all R in formula (I) are simultaneously hydrogens.

It is particularly preferred that the spirobifluorene compound is selected from the group consisting of (Spiro-TTB)

(Spiro-iPr-TAD) ; and (Spiro-iPr$_2$N-TAD)

It is likewise preferred that the glass transition temperature of the spirobifluorene compound lies between 120° C. and 250° C., and the highest occupied molecular orbital of the compound lies at an energy level between 4.5 eV and 5.4 eV, preferably between 4.8 eV and 5.2 eV.

The object is also achieved by an organic semiconductor material comprising an organic matrix material and an organic dopant, the organic matrix material at least partly comprising one or more compounds which are used as matrix materials in accordance with the invention.

It is likewise preferred that the dopant is 2,3,5,6-tetrafluoro-7,7,8,8-tetracyanoquinodimethane or a derivative thereof. However, further dopants having similar acceptor action and equal or larger molecular mass are possible; see, for example, DE10357044.6. It is particularly preferred that the molar doping ratio of dopant to matrix material is between 1:1 and 1:10 000.

The object is further achieved by an electronic component in which an organic matrix material is used which is comprised at least partly of a spirobifluorene compound which is envisaged as a matrix material in accordance with the invention.

Finally provided is the electronic component in the form of an organic light-emitting diode (OLED), a photovoltaic cell, an organic solar cell, an organic diode or an organic field-effect transistor.

The invention is based on the surprising finding that use of the organic matrix material described for producing an organic semiconductor material affords thermally stable and doped hole transport layers for use in organic semiconductor components. The use of the matrix materials provides bole transport materials which can be applied by vapour deposition, so that they lead, by coevaporation under reduced pressure with a strong organic electronic acceptor, to layers having a high hole conductivity.

When the organic matrix materials described are used, a stable, singly positively charged cationic state of the hole transport material is achieved.

Further advantages and features of the present invention are evident from the detailed description of exemplary organic matrix materials which follows, and also the appended drawings, in which

DETAILED DESCRIPTION OF EMBODIMENTS

EXAMPLES

A. Preparation of 2,2',7,7'-tetrakis(N,N-di-p-methylphenylamino)-9,9'-spirobifluorene (spiro-TTB)

2,2',7,7'-Tetrabromo-9,9'-spirobifluorene (10 g, 15.8 mmol), di-p-tolylamine (14.2 g, 72.1 mmol) and sodium tert-butoxide (9.6 g, 100 mmol) are stirred in 100 ml of anhydrous toluene under nitrogen at 60° C. for 1 h. Subsequently, tri-tert-butylphosphine. (200 mg, 1.0 mmol, 6.3% based on tetrabromospirobifluorene) and palladium(II) acetate (92 mg, 0.4 mmol, 2.6% based on tetrabromospirobifluorene) are added and the reaction mixture is heated to reflux under nitrogen. The progress of the reaction is monitored by thin-layer chromatography (eluent: 50% hexane in dichloromethane). After 2.5 h, no reactant can any longer be detected in the TLC. The reaction mixture is cooled, admixed with a solution of 100 mg of KCN in 20 ml of water and stirred at 60° C. for another 1 h. After cooling to room temperature, the phases are separated, and the organic phase is dried over sodium sulphate and the solvent is removed. The crude product is recrystallized twice from dioxane and subsequently reprecipitated from a little dichloromethane in hexane and dried under reduced pressure.

Yield: 15.0 g (13.8 mmol, 87% of theory) of slightly greenish powder. $^1$H NMR (500 MHz, CDCl$_3$+hydrazine hydrate):

7.40 (d, 1H, J=7.8), 7.00 (d, 4H, J=8.3), 6.88 (d, 4H, J=8.3), 6.85 (dd, 1H, J=8.3, J=2.0), 6.67 (d, 1H, J=2.0), 2.30 (s, 6H). $^{13}$C NMR (127.5 MHz, CDCl$_3$+hydrazine hydrate): 149.8, 146.7, 145.3, 136.1, 131.5, 129.5, 124.0, 123.2, 119.9, 119.3, 65.3, 20.6.

B. Preparation of 2,2',7,7'-tetrakis(N,N-di-p-isopropylphenylamino)-9,9'-spirofluorene (spiro-iPr-TAD)

4-Isopropyliodobenzene

4-Isopropylaniline (49.5 g, 366 mmol) is suspended in 200 ml of dist. water and admixed gradually under ice cooling with 200 ml of semiconcentrated sulphuric acid. Subsequently, a solution of sodium nitrite (25.5 g, 370 mmol) in 200 ml dist. water is added dropwise at such a rate that the temperature does not rise above 20° C. On completion of the dropwise addition, the mixture is stirred at 2° C. for another 20 min. The resulting clear reddish diazonium salt solution is now added through a filter to a solution of potassium iodide (135.0 g, 813 mmol) in 200 ml of dist. water. The reaction mixture is stirred at 80° C. for 1 h. In the course of this, the solution becomes black with vigorous gas evolution and an oily organic phase separates out. After cooling, the organic phase is removed and the aqueous phase is extracted four times more with 100 ml of ether. The combined organic phases are washed with dilute sodium hydroxide solution and dist. water, and dried over sodium sulphate. After the solvent has been removed, the crude product is distilled in a membrane-pump vacuum. The slightly reddish target product distils over at a temperature of 100-105° C. (15 mbar).

Yield: 75.3 g (310 mmol, 83% of theory) of slightly reddish liquid. $^1$H NMR (500 MHz, CDCl$_3$): 7.60 (d, 2H, J=8.3), 6.98 (d, 2H, J=8.3), 2.85 (q, 1H, J=6.8), 1.22 (d, 6H, J=6.8). $^{13}$C NMR (127.5 MHz, CDCl$_3$): 148.4, 137.3, 128.6, 90.6, 33.7, 23.8.

N-Acetyl-4-isopropylaniline

Acetic anhydride (26.0 g, 254 mmol) is slowly added dropwise to a solution of 4-isopropylaniline (17.2 g, 127 mmol) in 80 ml of chloroform. In the course of this, intense heating of the reaction mixture occurs. On completion of the dropwise addition, the mixture is stirred at room temperature for another 2 h. The reaction mixture is concentrated to dryness and the resulting, reddish-white solid is recrystallized from hexane.

Yield: 21.1 g (120 mmol, 94% of theory) of white solid. $^1$H NMR (500 MHz, CDCl$_3$): 7.88 (s, 1H), 7.40 (d, 2H, J=8.3), 7.14 (d, 2H, J=8.3), 2.86 (q, 1H, J=6.8), 1.21 (d, 6H, J=6.8). $^{13}$C NMR (127.5 MHz, CDCl$_3$): 168.6, 144.9, 135.6, 126.7, 120.2, 33.5, 24.3, 23.9. Melting point: 107° C. (literature (Dyall, Aus. J. Chem. 17, 1964, 419): 104-105° C.).

N-Acetyl-N,N-di(4-isopropylphenyl)amine

4-Isopropyliodobenzene (29.2 g, 118 mmol), N-acetyl-4-isopropylaniline (21.0 g, 118 mmol), copper powder (15.0 g, 237 mmol), potassium carbonate (65.4 g, 474 mmol) and 18-crown-6 (2.9 g, 12 mmol) are heated to reflux in 200 ml of 1,2-dichlorobenzene. The reaction is monitored by thin-layer chromatography (eluent: 10% THF in dichloromethane). After 48 h, the still-hot reaction mixture is filtered, the filter residue is washed thoroughly and the solvent is removed on a rotary evaporator. The crude product is chromatographed on silica gel using 10% THF in dichloromethane. The product fractions are concentrated to dryness, recrystallized from hexane and dried under reduced pressure.

Yield: 14.31 g (48 mmol, 41% of theory) of slightly brownish solid. $^1$H NMR (500 MHz, CDCl$_3$): 7.21 (m, 8H), 2.90 (s (br.), 2H), 2.04 (s, 3H), 1.23 (s(br.), 12H).

N,N-Di-(4-isopropylphenyl)amine

N-Acetyl-N,N-di(4-isopropylphenyl)amine (5.4 g, 18.4 mmol) are heated to reflux in 100 ml of 20% aqueous ethanol. The reaction is monitored by thin-layer chromatography. After 30 h, no reactant is any longer detectable in the TLC.

The ethanolic solution is poured into dist. water, and the brownish precipitate is filtered off with suction, dissolved in dichloromethane and dried with sodium sulphate. The solution is concentrated and chromatographed through a short silica gel column with 50% dichloromethane in hexane. The product fractions are concentrated to dryness and the product is dried under reduced pressure.

Yield: 4.0 g (16 mmol, 86% of theory) of slightly brownish solid. $^1$H NMR (500 MHz, CDCl$_3$): 7.12 (d, 4H, J=8.3), 6.99 (d, 4H, J=8.3), 5.55 (s(br.), 1H), 2.86 (q, 2H, J=6.8), 1.24 (d, 12H, J=6.8). $^{13}$C NMR (127.5 MHz, CDCl$_3$): 141.3, 127.1, 117.7, 33.4, 24.1.

2,2',7,7'-Tetrakis(N,N-di-p-isopropylphenylamino)-9,9'-spirobifluorene (spiro-iPr-TAD)

2,2',7,7'-Tetrabromo-9,9'-spirobifluorene (1.7 g, 2.6 mmol), N,N-di-4-isopropylphenylamine (3.0 g, 12.0 mmol) and sodium tert-butoxide (1.6 g, 17 mmol) are stirred in 100 ml of anhydrous toluene under nitrogen at 60° C. for 1 h. Subsequently, tri-tert-butylphosphine (4.8 mg, 0.24 mmol, 9.2% based on tetrabromospirobifluorene) and palladium(II) acetate (27 mg, 0.12 mmol, 4.6% based on tetrabromospirobifluorene) are added and the reaction mixture is heated to reflux under nitrogen. The progress of the reaction is monitored by thin-layer chromatography (eluent: 20% dichloromethane in hexane). After 3.5 h, no reactants can any longer be detected in the TLC. The reaction mixture is cooled, admixed with a solution of 100 mg of KCN in 20 ml of water, and stirred at 60° C. for another 1 h. After cooling to room temperature, the phases are separated, and the organic phase is dried over sodium sulphate and the solvent is removed. The crude product is recrystallized twice from dioxane and subsequently dried under reduced pressure.

Yield: 2.8 g (2.1 mmol, 81% of theory) of slightly yellowish, finely crystalline powder. $^1$H NMR (500 MHz, CDCl$_3$): 7.41 (d, 1H, J=8.3), 7.05 (d, 4H, J=8.3), 6.90 (m, 5H). 6.72 (s (br.) 1H), 2.85 (q, 2H, J=6.8), 1.24 (d, 12H, J=6.8). $^{13}$C NMR (127.5 MHz, CDCl$_3$): 150.7, 147.5, 146.3, 143.3, 137.2, 127.6, 125.3, 123.8, 120.8, 120.7, 66.2, 34.1, 24.8. Tg: 144° C., Tk: 166° C., Tm: 363° C.

Figure 1:
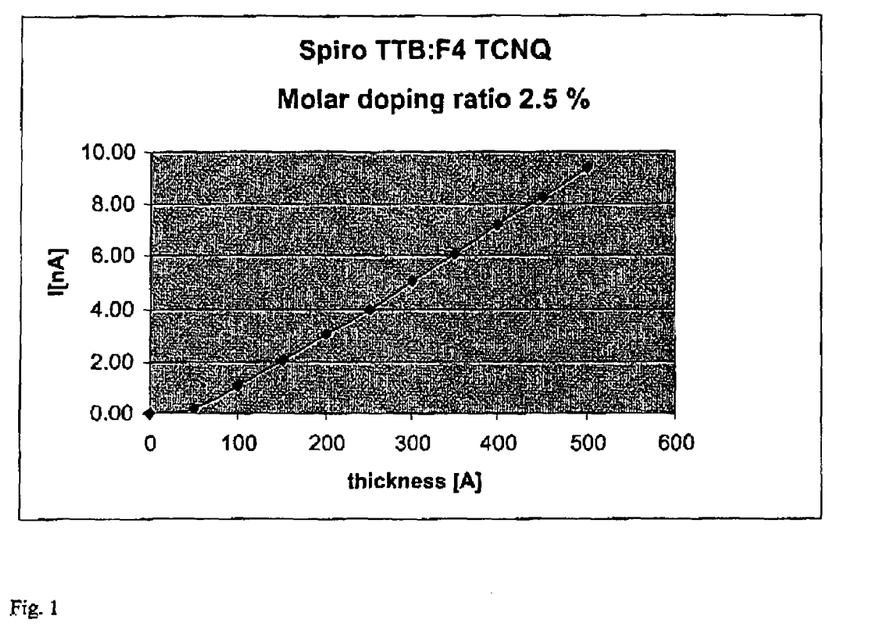
FIG. 1 shows the dependence of the lateral current on the layer thickness for a transport layer of the organic matrix material spiro-TTB (doped with F4-TCNQ)
Figure 2:
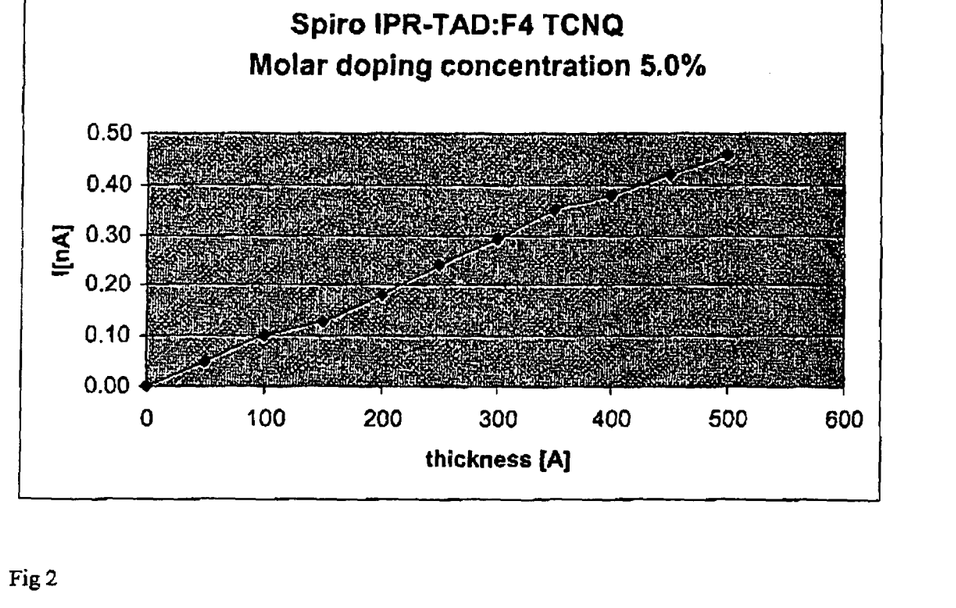
FIG. 2 shows the dependence of the lateral current on the layer thickness for a transport layer of the organic matrix material spiro-iPr-TAD (doped with F4-TCNQ)

The two organic materials spiro-TTB and spiro-iPr-TAD were each doped with F4-TCNQ and tested in conductivity measurements. For these measurements, the doped layer was applied by coevaporation under reduced pressure over two approx. 5 mm-wide contacts (made of indium tin oxide, ITO) which, were applied to a glass substrate at a distance of 1 mm from one another. The contacts were connected externally to a current-voltage measuring instrument, which allowed the lateral current to be measured at a fixed applied voltage. From this lateral current, the conductivity of the layer is then calculated by a simple resistance relationship. The conductivity can be determined with the aid of the following equation:

Conductivity=(lateral current*distance)/(width*layer thickness)

FIGS. 1 and 2 each show the increase in the lateral current with the layer thickness for the two doped matrix materials. The conductivity of a 50 nm-thick layer of spiro-TTB doped with 2.5% F4-TCNQ is approx. 1.6 E-5 S/cm, while the conductivity of a 50 nm-thick layer of spiro-iPr-TAD doped with 5% F4-TCNQ is approx. 8 E-7 S/cm.

One embodiment of an inventive electronic component in the form of an OLED with an organic matrix material, as is to be used in accordance with the invention, can be produced and comprises, in the case of normal design emitting through the substrate, the following layer arrangement:

1. carrier substrate: glass,
2. bottom electrode (anode A): ITO,
3. p-doped, hole-injecting and -transporting layer: spiro-TTB: F4TCNQ (2.5% molar doping concentration),
4. thin bole-side intermediate layer of a material whose band positions match the band positions of the layers surrounding them: spiro-TAD,
5. light-emitting layer (possibly doped with emitter dye): TCTA (4,4',4"-tris(N-carbazolyl)triphenylamine): Irppy 3 (fac-tris(2-phenylpyridine)iridium),
6. thin electron-side intermediate layer of a material whose band positions match the band positions of the layers surrounding them: BPhen (4,7-diphenyl-1,10-phenanthroline),
7. n-doped, electron-injecting and -transporting layer BPhen doped with caesium (approx. 1:1 molar concentration),
8. top electrode (cathode K): aluminum, and
9. encapsulation for exclusion of environmental influences: covering glass

Figure 3:
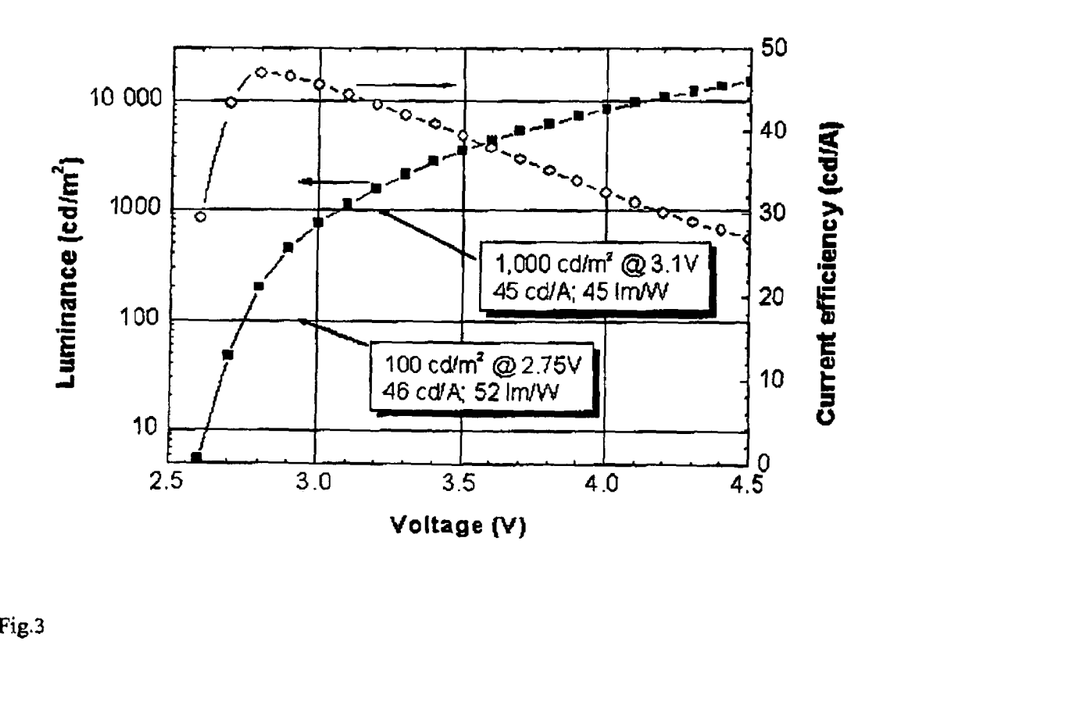
FIG. 3 shows the luminance voltage and power efficiency voltage characteristics of an organic light-emitting diode having doped transport layers and spiro-TFB (doped with F4 TCNQ) as a p-dopant.

A thus produced organic light-emitting diode was examined with regard to the luminance voltage and current efficiency voltage characteristics, the results of which are shown in FIG. 3. Due to the doping of the organic hole transport layer, his exhibits a very steep current-voltage characteristics and thus a very steep luminance voltage characteristics (left-hand axis). The luminance of 100 cd/m$^2$ and 1000 cd/m$^2$ are attained at voltages of 2.75 V and 3.1 V. Owing to the ideal arrangement of the doped hole and electron transport layers and of the two intermediate layers, the current efficiencies of light generation are likewise very high and constant over a wide brightness range: 46 cd/A and 45 cd/A. Owing to the stable hole transport layer, this OLED can be operated stably at relatively high temperatures (up to above 100° C.) without a reduction in the optoelectronic properties.

Features of the invention disclosed in the above description, in the claims and in the drawings may be essential either individually or in any combination for the realization of the invention in its different embodiments.

The invention claimed is:

1. Organic semiconductor material containing a hole transport layer of an organic matrix material doped with an organic dopant by coevaporation characterized in that the organic matrix material comprises at least partly one or more spiro-bifluorene compounds of the formula (I)

(I; R-Spiro-TAD)

and/or the formula (II)

(II; Spiro-TM-TAD)

wherein each R and/or R' in formula (1) and formula (II) is independently selected from the group consisting of hydrogen, methyl, ethyl, n-propyl, isopropyl, n-butyl, isobutyl, tert-butyl, $NH_2$, $N(CH_4)_2$, and $NPh_2$, wherein not all R in formula (I) are simultaneously hydrogen and wherein in formula (II) R is not hydrogen, wherein the glass transition temperature of the organic matrix material being at least 120° C. and the highest occupied molecular orbital (HOMO) of the matrix material lying at a maximum energy level of 5.4 eV.

2. Organic semiconductor material according to claim 1, characterized in that the dopant is 2,3,5,6-tetrafluoro-7,7,8,8-tetracyanoquinodimethane or a derivative thereof.

3. Organic semiconductor material according to claim 1, characterized in that the molar doping ratio of dopant to matrix material is between 1:1 and 1:10.000.

4. Electronic component having an organic semiconductor material containing a hole transport layer of an organic matrix material doped with an organic dopant by coevaporation, characterized in that the organic matrix material is comprised at least partly of a spiro-bifluorene compound of the formula (I)

(I; R-Spiro-TAD)

and/or the formula (II)

(II; Spiro-TM-TAD)

wherein each R and/or R' in formula (1) and formula (II) is independently selected from the group consisting of hydrogen, methyl, ethyl, n-propyl, isopropyl, n-butyl, isobutyl, tert-butyl, NH$_2$, $_{N(CH4)}$$_2$, and NPh$_2$, wherein not all R in formula (I) are simultaneously hydrogen and wherein in formula (II) R is not hydrogen, wherein the glass transition temperature of the organic matrix material being at least 120° and the highest occupied molecular orbital (HOMO) of the matrix material lying at a maximum energy level of 5.4 eV.

5. Electronic component according to claim 4 in the form of an organic light-emitting diode (OLED), a photovoltaic cell, an organic solar cell, an organic diode or an organic field-effect transistor.

6. Method for preparing an organic semiconductor or material comprising a hole transport layer, the method comprising producing the hole transport layer by co-evaporating and applying by vapor deposition a dopant and an organic matrix material, wherein the organic matrix material is comprised at least partly of a spiro-bifluorene compound of the formula (I)

(I; R-Spiro-TAD)

and/or of the formula (II)

(II; Spiro-TM-TAD)

(II; Spiro-TM-TAD)

wherein each R and/or R' in formula (I) and formula (II) is independently selected from the group consisting of hydrogen, methyl, ethyl, n-propyl, isopropyl, n-butyl, isobutyl, tert-butyl, NH$_2$, N(CH$_4$)$_2$, and Nph$_2$, wherein not all R in formula (I) are simultaneously hydrogen and wherein in formula (II) R is not hydrogen, wherein the glass transition temperature of the organic matrix material being at least 120° C. and the highest occupied molecular orbital (HOMO) of the matrix material lying at a maximum energy level of 5.4 eV.

7. Method according to claim 6, wherein the spirobifluorene compound is selected from the group consisting of:

(Spiro-TTB)

(Spiro-iPr-TAD)

-continued (Spiro-iPr₂N-TAD)

8. Method of claim 6, characterized in that the glass transition temperature of the spiro-bifluorene compound lies between 120° C. and 250° C., and the highest occupied molecular orbital of the compound lies at an energy level between 4.5 eV and 5.4 eV.

9. Method according to claim 8, characterized in that the highest occupied molecular orbital of the compound lies between 4.8 eV and 5.2 eV.

* * * * *

UNITED STATES PATENT AND TRADEMARK OFFICE
CERTIFICATE OF CORRECTION

PATENT NO. : 7,540,978 B2  Page 1 of 1
APPLICATION NO. : 11/196491
DATED : June 2, 2009
INVENTOR(S) : Martin Pfeiffer et al.

It is certified that error appears in the above-identified patent and that said Letters Patent is hereby corrected as shown below:

In Claim 4 at Column 15, Line 32, the characters "N(CH" should read subscript size.

In Claim 6 at Column 16, Line 55, should read $NPh_2$.

Signed and Sealed this

Twenty-fifth Day of August, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,540,978 B2 | Page 1 of 1 |
| APPLICATION NO. | : 11/196491 | |
| DATED | : June 2, 2009 | |
| INVENTOR(S) | : Martin Pfeiffer et al. | |

It is certified that error appears in the above-identified patent and that said Letters Patent is hereby corrected as shown below:

In Claim 4 at Column 15, Line 32, the characters "N(CH" should read standard size.

Signed and Sealed this

Twenty-seventh Day of October, 2009

David J. Kappos
*Director of the United States Patent and Trademark Office*